US007020174B2

(12) United States Patent
Lee

(10) Patent No.: US 7,020,174 B2
(45) Date of Patent: Mar. 28, 2006

(54) LASER DIODE MODULE FOR OPTICAL COMMUNICATION

(75) Inventor: Sang-Ho Lee, Suwon-shi (KR)

(73) Assignee: Samsung Electronics Co, LTD, Suwon-si (KR)

( * ) Notice: Subject to any disclaimer, the term of this patent is extended or adjusted under 35 U.S.C. 154(b) by 140 days.

(21) Appl. No.: 10/443,182

(22) Filed: May 22, 2003

(65) Prior Publication Data

US 2004/0131096 A1 Jul. 8, 2004

(30) Foreign Application Priority Data

Jan. 2, 2003 (KR) .................. 10-2003-0000139

(51) Int. Cl.
*H01S 5/00* (2006.01)
(52) U.S. Cl. ........................ 372/50.1; 372/75
(58) Field of Classification Search ............ 372/32, 372/34, 45, 36, 75, 49.01; 257/15; 62/3.3
See application file for complete search history.

(56) References Cited

U.S. PATENT DOCUMENTS

| 6,060,656 A * | 5/2000 | Dresselhaus et al. ......... 257/15 |
| 6,230,497 B1 * | 5/2001 | Morris et al. ................. 62/3.3 |
| 6,567,447 B1 * | 5/2003 | Yoshida et al. ............... 372/49 |
| 6,721,341 B1 * | 4/2004 | Aikiyo et al. ................. 372/36 |
| 2002/0121094 A1 * | 9/2002 | VanHoudt ..................... 62/3.3 |
| 2003/0058907 A1 * | 3/2003 | Nasu et al. .................... 372/34 |

* cited by examiner

*Primary Examiner*—Minsun Oh Harvey
*Assistant Examiner*—Tuan N. Nguyen
(74) *Attorney, Agent, or Firm*—Cha & Reiter, LLC

(57) ABSTRACT

A laser diode module for optical communication is disclosed and includes a plurality of leads, a housing having a vertical wall, a heat sink disposed on the housing, a superlattice microcooler disposed on the heat sink, a laser diode disposed on one side of the superlattice microcooler, a photo diode to convert the received light emitted from the laser diode into current, and a light condensing unit disposed on one side of the heat sink to condense the laser beams emitted from the laser diode.

6 Claims, 3 Drawing Sheets

LASER DIODE MODULE FOR OPTICAL COMMUNICATION

CLAIM OF PRIORITY

This application claims priority to an application entitled "laser diode module for optical communication," filed with the Korean Intellectual Property Office on Jan. 2, 2003 and assigned Ser. No. 2003-139, the contents of which are hereby incorporated by reference.

BACKGROUND OF THE INVENTION

1. Field of the Invention

The present invention relates to a laser diode module for optical communication, and more particularly to a laser diode module for optical communication employing a superlattice microcooler.

2. Description of the Related Art

As is generally known in the art, a semiconductor laser device is made of a semiconductor device that is based on a P—N bonding structure and employs quantum electron concepts. In particular, a semiconductor laser diode emits light corresponding to reduced energies produced from the recombination of vacancies and holes. The recombination of vacancies and holes are induced intentionally by applying current into a thin film, i.e., an active layer, composed of semiconductor materials.

The semiconductor laser diode has certain characteristics. For example, being small in size, in comparison with a solid laser such as a He—Ne laser or an Nd—YAG laser, and being able to control the intensity of light through controlling current. Semiconductor laser diodes which have such characteristics have been employed as light sources for optical recording devices and optical restoring devices, when they have a low output and short wavelength. And, they have been employed as light sources for optical communication, when they have a long wavelength. Also, in the case of high output, they have been employed as excitation devices for solid laser devices such as an Nd—YAG laser.

In regard to an optical module for communication, it is very important to control the wavelength. Moreover, it requires an additional structure to remove heat produced during the activation of the optical module and the temperature increase produced from the surrounding temperature is moved toward the outside of the package quickly, in order to achieve the proper wavelength control.

As a result, several packaging structures and methods have been suggested, wherein heat produced during the activation of the optical device is quickly discharged to the outside in order to meet such requirements.

The laser diode module is an integrated body having a laser diode light source fixed to a head and incidental devices, such as a cooler for cooling the laser diode, a photo detector for sensing output of the laser diode, and a temperature sensor for sensing the temperature of the whole head, are additionally disposed on the head.

Generally, in regard to the semiconductor laser diode module, a heat sink wherein a laser diode chip is loaded, is provided with (1) a cooling device such as a thermoelectric cooler, etc., (2) a thermistor for detecting heat, and (3) a photo diode for sensing light from the chip are provided with the laser diode module incidentally.

FIG. 1 is a schematic cross-sectional view of a conventional laser diode module for optical communication. FIG. 2 is a shows the construction of the thermoelectric cooler in FIG. 1.

Referring to FIG. 1, in regard to the laser diode module for optical communication. a plurality of leads (not shown) protruding sideward are provided in the lower surface of the laser diode module, and a housing 10 formed with sidewall protruding to a certain height from the upper surface thereof constitutes a basic frame of the laser diode module. Further, a thermoelectric cooler (TEC) 11 is fixed to a central portion of the upper surface in the housing 10 with a cooling side thereof facing toward upper direction, and a heat sink 12 having a certain height is provided at the cooling side of the thermoelectric cooler 11 for absorbing heat emitted from a laser diode 15. Also, a submount 13 is provided on the heat sink 12, and the laser diode 15 is supported by a first submount 14 and a photo diode 17 is supported by a second submount 16 are fixed on the submount 13. A lens 18 is also disposed on the submount 13 to collect laser beams emitted from the laser diode 15.

Thermoelectric cooler (TEC) 11 has a structure as shown in FIG. 2, wherein a plurality of P type and N type pins 23, e.g., 20 to 50 pins, are provided between the cold side (active cooling) 21 and the hot side (heat rejection) 22 of the cooler.

However, in regard to the conventional thermoelectric cooler, the plurality of pins are assembled manually and thereby results in manufacturing process complexity and high production costs, which makes it difficult to achieve a low cost laser diode module for optical communication. Additionally, the thermoelectric cooler is too large in size to be installed through micro optical subassembly (OSA), such as a mini-plat requisite to optical transmitter/receiver (Tx/Rx) and a TO-can package, etc.

SUMMARY OF THE INVENTION

The present invention is directed to a laser diode module for optical communication, which is a micro thermoelectric cooler capable of being installed through micro optical subassembly and reduces manufacturing cost.

In accordance with the principles of the present invention a laser diode module for optical communication is provided, which includes a plurality of leads, a housing having a vertical wall, a heat sink disposed on the housing, a superlattice microcooler disposed on the heat sink, a laser diode disposed on one side of the superlattice microcooler and emitting laser beams, a photo diode receiving light emitted from the laser diode and transforming it into current, and a light condensing unit disposed on one side of the heat sink and condensing the laser beams emitted from the laser diode.

In one embodiment of the present invention, the superlattice microcooler preferably comprises a semiconductor substrate, a buffer layer formed on the semiconductor substrate, a semiconductor layer formed on one side of the buffer layer and having a superlattice structure, a cap layer formed on the semiconductor layer, and a metal layer formed on one side of the cap layer and on one side of the buffer layer respectively. Further, the semiconductor layer having a superlattice structure may also preferably be made of a SiGeC/Si layer or a SiGe/Si layer.

BRIEF DESCRIPTION OF THE DRAWINGS

The present invention will be more apparent from the following detailed description taken in conjunction with the accompanying drawings, in which.

DETAILED DESCRIPTION OF THE PREFERRED EMBODIMENT

Figure 1:
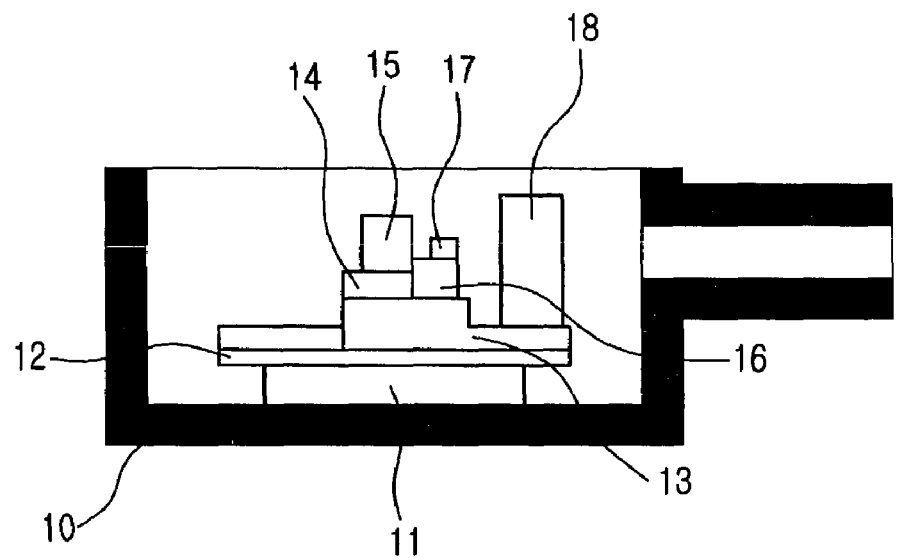
FIG. 1 is a schematic cross-sectional view showing a conventional laser diode module for optical communication.
Figure 2:
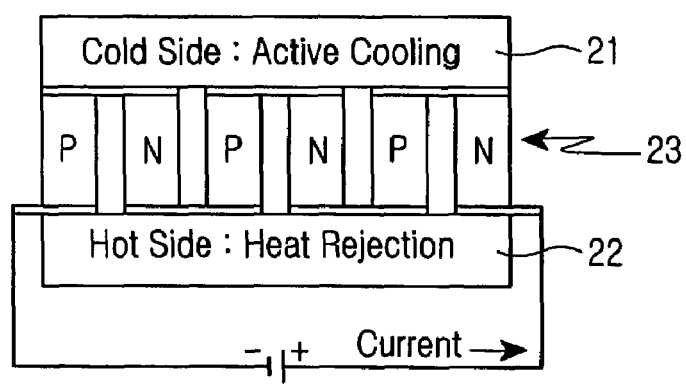
FIG. 2 is shows the construction of the thermoelectric cooler of FIG. 1.

In the following description of the present invention, for purposes of explanation rather than limitation, specific details are set forth such as the particular architecture, interfaces, techniques, etc., in order to provide a thorough understanding of the present invention. However, it will be apparent to those skilled in the art that the present invention may be practiced in other embodiments that depart from these specific details. Moreover, it will be recognized that certain aspects of the figures are simplified for explanation purposes and that the full system environment for the invention will comprise many known functions and configurations all of which need not be shown here. In the drawings, the same or similar elements are denoted by the same reference numerals even though they are depicted in different drawings.

Figure 3:
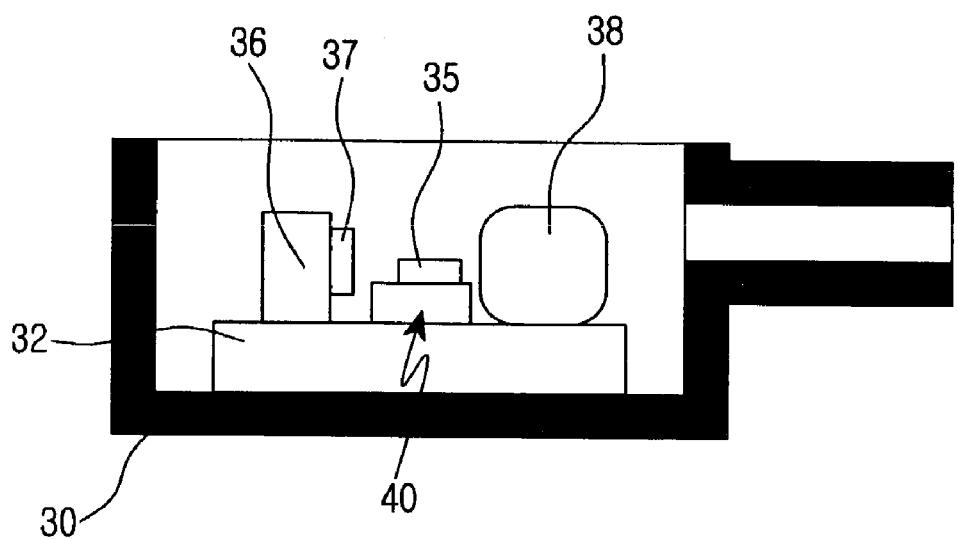
FIG. 3 is a schematic cross-sectional view of a laser diode module for optical communication in accordance with the principles of the present invention.
Figure 4:
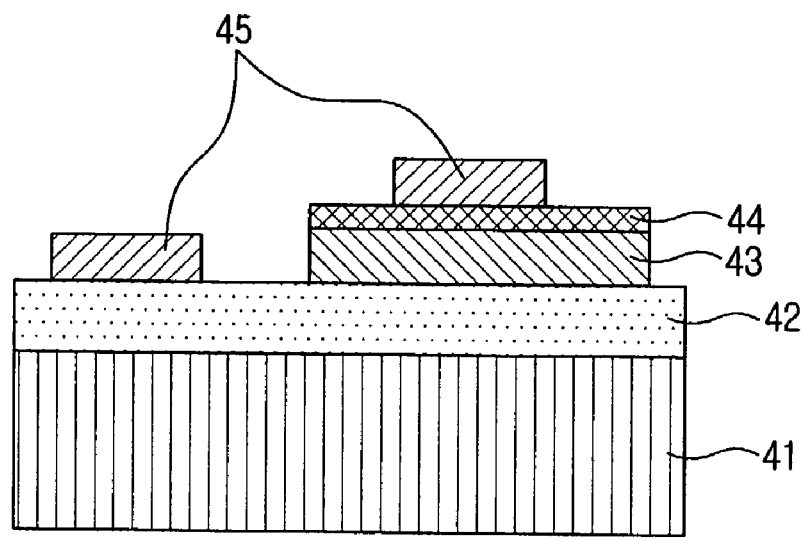
FIG. 4 is a cross-sectional view showing construction of a superlattice microcooler employed in the laser diode module for optical communication of FIG. 3, in accordance with the principles of the present invention.
Figure 5:
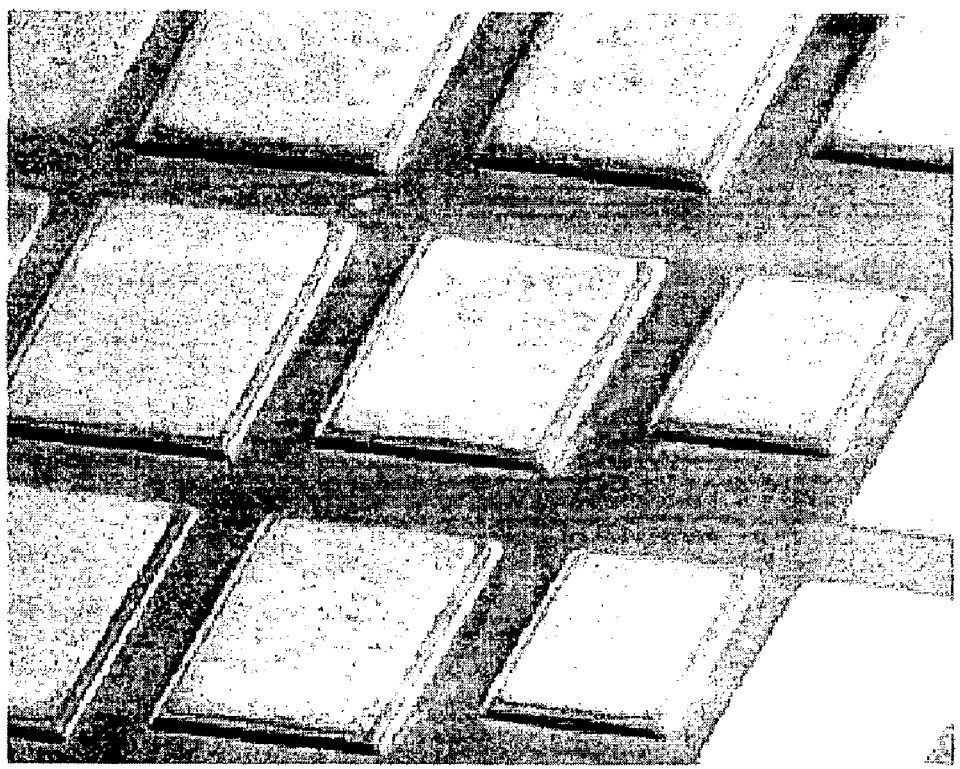
FIG. 5 is a high magnification microphotograph of FIG. 4.

FIG. 3 is a schematic cross-sectional view of a laser diode module for optical communication in accordance with the principles of the present invention. FIG. 4 is a cross-sectional view showing construction of a super-lattice micro cooler employed in the laser diode module for optical communication in accordance with the present invention of FIG. 3. FIG. 5 is a high magnification microphotograph of FIG. 4.

Referring to FIG. 3, the laser diode module for optical communication of the present invention comprises a plurality of leads (not shown), a housing 30 having a vertical wall, a heat sink 32, a superlattice microcooler 40, a laser diode 35, a submount 36, a photo diode 37, and a light condensing unit 38.

Heat sink 32 is disposed on the housing and absorbs heat emitted from the optical device disposed on heat sink 32.

Superlattice microcooler 40 is disposed on heat sink 32 and acts to cool the heat produced during the activation of laser diode 35. Superlattice microcooler 40 has structure as shown in FIG. 4.

Referring to FIG. 4, the superlattice microcooler according to a preferred embodiment of the present invention comprises a silicon (Si) substrate 41, a buffer layer 42 formed on the Si substrate 41, a superlattice layer 43 made of SiGe/Si formed on one side of the buffer layer 42, a SiGe cap layer 44 formed on the superlattice layer 43, and a contact metal layer 45 formed on one side of the SiGe cap layer 44 and on one side of buffer layer 42 respectively.

SiGe/Si superlattice layer 43 is composed of 10 nm SiGe/10 nm Si (100×), has a thickness of 2 µm, and can be formed through a molecular beam epitaxy (MBE) process. A SiGeC/Si layer besides SiGe/Si layer can be cited as an example for the superlattice layer.

Referring now to FIG. 3 and FIG. 4, laser diode 35 is disposed on metal layer 45 of superlattice microcooler 40, and when a current of 0.3 A is applied to metal layer 45 through wire bonding, heat produced during activation of the laser diode can be cooled effectively through the cooling action of super-lattice layer 43.

Referring again to FIG. 3, photo diode 37 is fixed on submount 36 disposed on one side of heat sink 32 and acts to receive and convert light emitted from laser diode 35 into current.

Light condensing unit 38 is disposed on one side of heat sink 32 and acts to condense laser beams.

Although the present invention has been described in relation to preferred embodiments, various modifications, additions and substitutions are possible, without departing from the scope and spirit of the present invention. For example, according to another embodiment of the present invention, the laser diode module can be locally cooled with the aid of a micro thermoelectric cooler utilizing a micro electromechanical systematic (MEMS) technology to thereby make it possible to apply to a micro module as it has been in the embodiment of the present invention explained above. The detailed applying technology has the same structure as described above.

The laser diode module for optical communication according to the present invention has a number of advantages, by employing the superlattice microcooler instead of the conventional thermoelectric cooler as a cooler.

First, the production process of the laser diode module for optical communication has been simplified, and it is possible to produce a low cost cooling module and enhance cost competitive prices.

Second, it is possible to install a cooling type optical subassembly (OSB) within a micro module such as a LC type module.

Third, it is possible to produce the micro module because a TO-18 can package can be employed as a submount.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A laser diode module for optical communication, comprising: a housing having a vertical wall; a heat sink disposed on the housing; a superlattice microcooler disposed on the heat sink; a laser diode disposed on one side of the superlattice microcooler; a photo diode to convert light received from the laser diode into current; and a light condensing unit, disposed on one side of the heat sink, to condense laser beams emitted from the laser diode, wherein said microcooler comprises an SiGe/Si superlattice layer composed of 10 nm SiGe/10 nm Si (100×), for a total thickness of 2 um, and formable through a molecular beam epitaxy (MBE) process, wherein superlattice layer is alternatively configurable as SiGeC/Si rather than SiGe/Si.

2. The laser diode module as claimed in claim 1, wherein the superlattice microcooler is made of a micro thermoelectric cooler utilizing micro electromechanical systematic (MEMS) technology.

3. The laser diode module as claimed in claim 1, further including a plurality of leads protruding from the housing.

4. A laser diode module for optical communication, comprising: a housing having a vertical wall; a heat sink disposed on the housing; a superlattice microcooler disposed on the heat sink; a laser diode disposed on one side of the superlattice microcooler; a photo diode to convert light received from the laser diode into current; and a light condensing unit, disposed on one side of the heat sink, to condense laser beams emitted from the laser diode, wherein the superlattice microcooler comprises: a semiconductor substrate; a buffer layer formed on the semiconductor substrate; a semiconductor layer formed on one side of the buffer layer and having a superlattice structure; a cap layer formed on the semiconductor layer; and a metal layer formed on one side of the cap layer and on one side of the buffer layer respectively.

5. The laser diode module as claimed in claim 4, wherein the superlattice structure is made of a SiGeC/Si layer or a SiGe/Si layer.

6. The laser diode module as claimed in claim 4, wherein the laser diode is disposed on the metal layer.

* * * * *